(12) United States Patent
Pan et al.

(10) Patent No.: US 7,044,660 B2
(45) Date of Patent: May 16, 2006

(54) ERBIUM-DOPED FIBER AMPLIFIER AND INTEGRATED CIRCUIT MODULE COMPONENTS

(75) Inventors: Jing-Jong Pan, Milpitas, CA (US); Xiangdong Qiu, Cupertino, CA (US); Kejian Guan, San Jose, CA (US); Mingjie Zhang, San Jose, CA (US)

(73) Assignee: Lightwaves 2020, Inc., Milpitas, CA (US)

( * ) Notice: Subject to any disclaimer, the term of this patent is extended or adjusted under 35 U.S.C. 154(b) by 0 days.

(21) Appl. No.: 11/161,059

(22) Filed: Jul. 21, 2005

(65) Prior Publication Data

US 2005/0280888 A1 Dec. 22, 2005

Related U.S. Application Data

(62) Division of application No. 10/138,033, filed on May 3, 2002, now Pat. No. 6,922,281.

(51) Int. Cl.
*G02B 6/36* (2006.01)
*H01S 3/00* (2006.01)

(52) U.S. Cl. ....................... 385/93; 359/341.3
(58) Field of Classification Search ............... 385/93; 359/341.3
See application file for complete search history.

(56) References Cited

U.S. PATENT DOCUMENTS

| | | | | |
|---|---|---|---|---|
| 5,500,768 A | * | 3/1996 | Doggett et al. | 359/652 |
| 5,555,330 A | * | 9/1996 | Pan et al. | 385/39 |
| 5,642,448 A | * | 6/1997 | Pan et al. | 385/31 |
| 5,652,814 A | * | 7/1997 | Pan et al. | 385/24 |
| 5,812,717 A | * | 9/1998 | Gilliland | 385/93 |
| 5,815,623 A | * | 9/1998 | Gilliland et al. | 385/93 |
| 6,023,542 A | * | 2/2000 | Pan et al. | 385/24 |
| 6,071,017 A | * | 6/2000 | Gilliland et al. | 385/93 |
| 6,198,858 B1 | * | 3/2001 | Pan et al. | 385/24 |
| 6,283,644 B1 | * | 9/2001 | Gilliland et al. | 385/93 |
| 6,314,117 B1 | * | 11/2001 | Heim et al. | 372/43.01 |
| 6,370,290 B1 | * | 4/2002 | Ball et al. | 385/14 |
| 6,659,657 B1 | * | 12/2003 | Lin et al. | 385/92 |
| 2002/0141142 A1 | * | 10/2002 | Rookes | 361/538 |

* cited by examiner

*Primary Examiner*—Deandra M. Hughes
(74) *Attorney, Agent, or Firm*—Aka Chan LLP

(57) ABSTRACT

An EDFA with integrated input and output modules is presented. The integrated input module has a packaged pump laser diode mounted to the metal EDFA package to provide a heat sink for the pump laser diode which sends the pump laser light over a optical fiber section connected to the amplifying erbium-doped optical fiber section. The fiber section is formed from an optical fiber which better matches the transmission modes in the erbium-doped optical fiber section and has an end subsection of the single mode fiber for a larger numerical aperture. Collimating lenses also increase the coupling efficiency of the laser diode to the erbium-doped fiber section. The integrated output module has a photodiode with a tap filter to monitor the output power of the EDFA, an optical isolator to prevent interference in the erbium-doped optical fiber section. With a twin optical isolator, the integrated input and output modules can be arranged in different ways and combinations with the erbium-doped optical fiber section. The resulting EDFAs can be manufactured relatively inexpensively into an very small packages compared to current EDFA packages.

8 Claims, 6 Drawing Sheets

ERBIUM-DOPED FIBER AMPLIFIER AND INTEGRATED CIRCUIT MODULE COMPONENTS

CROSS-REFERENCES TO RELATED APPLICATIONS

This is a divisional application of U.S. patent application Ser. No. 10/138,033 filed May 3, 2002 now U.S. Pat. No. 6,922,281, which is incorporated herein by reference in its entirety.

BACKGROUND OF THE INVENTION

The present invention is related to optical devices for fiberoptic systems and networks and, in particular, to erbium-doped fiber amplifiers and their components.

In modern fiberoptic transmission systems and networks, such as Dense Wavelength Division Multiplexing (DWDM) optical networks, the erbium-doped fiber amplifier (EDFA) is employed nearly universally to amplify optical signals. The EDFA provides for optical-to-optical conversion and avoids OEO (Optical-Electrical-Optical) conversion where received optical signals were converted into electrical signals, retimed, reshaped and regenerated back into optical signals. EDFAs have the advantages of wideband, i.e., the ability to amplify signals over a wide range in frequency, high signal gain, low noise figure, high output power and low polarization sensitivity.

Hence the EDFA provides for savings in cost and complexity. Nonetheless, EDFAs today are still expensive and are used primarily in the so-called "long-haul" or "backbone" fiberoptic networks which link nodes over long, intra-continental and even inter-continental, distances. Most of these fibers have been laid and the present challenge to fiberoptic developers are the "metro-," i.e., citywide, or smaller, networks. Much development effort has been directed toward a compact (for ease of installation) and cost-effective optical amplifier for metro-networks and upgrades of optical nodes in the long-haul networks. This effort includes conventional wideband EDFAs, semiconductor optical amplifiers (SOAs) and erbium-doped waveguide amplifiers (EDWAs). However, wideband EDFA is quite expensive for some applications, such as metro-networks and power compensation. In this case, narrow band EDFA is much more cost effective than wideband counterparts. SOAs have disadvantages of high noise figures, polarization-dependent gain (PDG) and cross talk; their applications are very limited. Likewise, EDWAs require very high pump power to provide sufficient gain and output power, while their noise figures are quite high. Therefore, EDFAs are still the most efficient approach in power conversion efficiency.

The present invention provides for a novel, low-cost, and highly compact EDFA.

SUMMARY OF THE INVENTION

The present invention provides for an EDFA system for amplifying optical signals received from one optical fiber and passing the amplified optical signals to the other optical fiber. The EDFA system has a section of erbium-doped optical fiber with each of its ends coupled to one of the optical fibers; and at least one integrated input module having a first optical fiber section connected to an end of the erbium-doped optical fiber section and a second optical fiber section connected to one of the optical fibers. The integrated input module has a WDM filter arranged with respect to the ends of the optical fiber sections so that optical signals received from one of the optical fiber sections is passed to the other of the optical fiber sections. The integrated input module has a laser diode arranged with respect to the WDM filter and the ends of the optical fiber sections so that pump light from the laser diode is passed to the first optical fiber section and the erbium-doped optical fiber section. The laser diode is mounted within an TO package in the integrated input module and the laser diode package is thermally connected to a metal package for the EDFA system to provide a heat sink for the laser diode operating a pump laser for the erbium-doped optical fiber section.

To increase the coupling efficiency of the laser diode to the erbium-doped optical fiber section, the integrated input module has two collimating lens for focusing the pump laser light on the end of first optical fiber section. The first optical fiber section is formed from a fiber which matches the transmission modes of the erbium-doped optical fiber section, but the end of the first fiber section is formed from a single mode fiber, SMF-28, for a larger numerical aperture.

Likewise, the integrated output module has many feature to efficiently monitor the output of the erbium-doped optical fiber section and to optically isolate the erbium-doped optical fiber section from errant signals. With a twin optical isolator, various combinations of the erbium-doped optical fiber section, integrated input module and integrated output module can be made.

An EDFA system can be manufactured relatively inexpensively and mounted in a very small package compared to current EDFAs.

DESCRIPTION OF THE SPECIFIC EMBODIMENTS

To amplify optical signals carried on an optical fiber, the optical fiber is severed and an EDFA is inserted between the two parts of the optical fiber. Optical signals are typically in the 1550 nm wavelength range; for WDM systems, the signals fall within specific wavelength ranges which define a grid of WDM communication channels. The EDFA increases the strength of these signals at their particular wavelengths.

Figure 1:
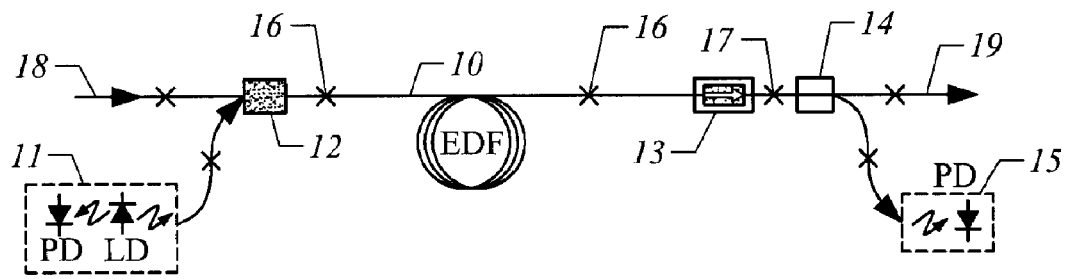
FIG. 1 is a representational diagram of a conventional EDFA.

FIG. 1 illustrates the general features, organization and operation of an EDFA between two parts 18 and 19 of an optical fiber carrying signals. The EDFA is formed by a section 10 of erbium-doped fiber, which amplifies the optical signals passing through the section 10. To provide the amplification energy for the EDF section 10, an optical pump in the form of a laser 11 is connected to one end of the section 10 by a WDM (Wavelength Division Multiplexer) 12. The WDM 12 is connected to the input optical fiber 18 which carries the optical signals into the EDFA and an output fiber from the pump laser 11. To block signals in the "wrong" direction and to monitor the operation of the EDFA, an optical isolator 13 and a tap coupler 14 are inserted between the other end of the EDF section 10 and the output optical fiber 19. The tap coupler 14 sends a small fraction of the signals from the section 10 to a photodiode 15. In the drawings fiber splices are indicated by the symbol, "X".

Operationally, the pump laser 11 generates light at energies higher than those of the communication signals in the 1550 nm range. Typically, the output of the pump laser 11 is at 980 nm, but other wavelengths are possible and may be used. The WDM 12 combines signals from the input optical fiber 18 and light of the pump laser 11 and sends both into the EDF section 10 which amplifies the 1550 nm wavelength signals from the energy provided by the 980 nm light. The amplified signals are passed to the output optical fiber 19 with the isolator 13 preventing signals from the output optical fiber 19 from entering the EDF section 10 and causing interference. The EDFA operation is monitored by the photodiode 15 and may be used to provide feedback control of the EDFA, such as for autopower control or autogain control. Likewise, the pump laser 11 often has a rear photodiode (PD) which monitors the output power of a laser diode (LD), the lasing element of the pump laser 11. In other EDFA arrangements, two pump lasers are often used for double pumping of the EDF section.

The drawbacks for this configuration is that there are a large number of devices, splicing losses between the SMF-28 optical fiber (e.g., the input optical fiber 18 and output optical fiber 19 of FIG. 1) which is conventionally used to the optical signals and the erbium-doped fiber section, potential noise figure degradation due to the insertion loss from the different single devices and the splicing points. In fact, in most EDFA applications, more optical components are added to the EDFA. Such arrangements are illustrated below.

Figure 2A:
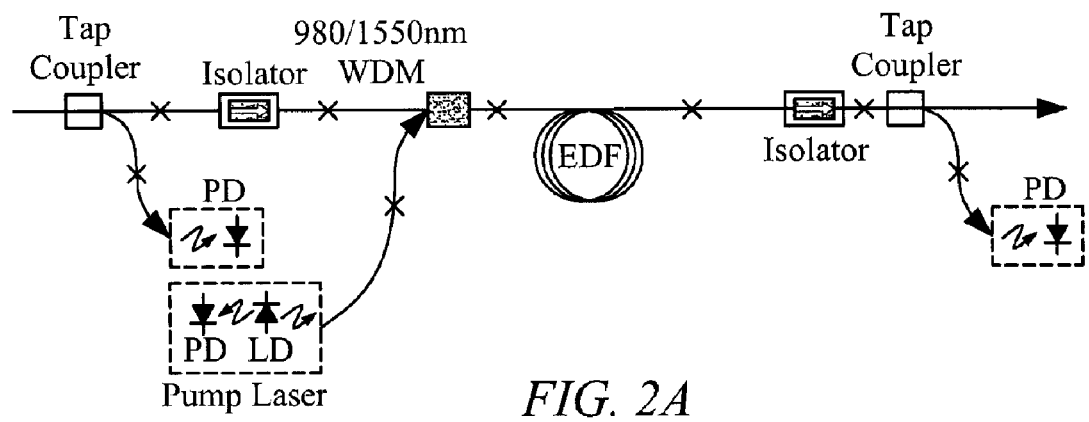
FIG. 2 is a representational diagram of a conventional EDFA with additional components.
FIG. 2B is a representational diagram of a conventional EDFA with an integrated tap/isolator component.
FIG. 2C is a representational diagram of a conventional EDFA with an integrated component.
FIG. 2D is a representational diagram of a conventional EDFA with an integrated pump laser component.
Figure 2B:
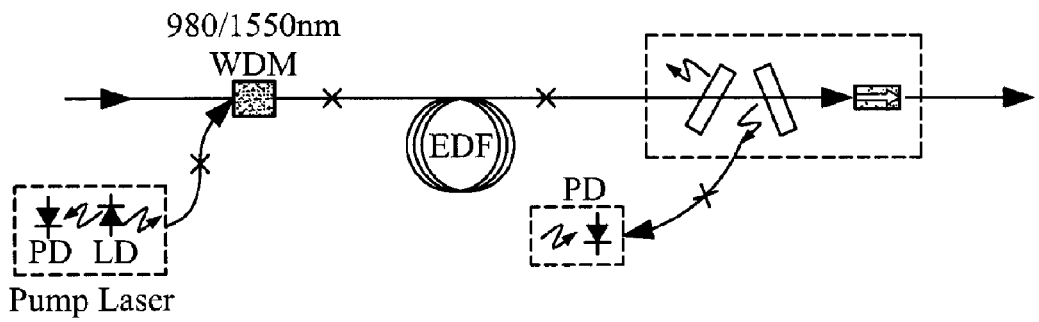
Figure 2C:
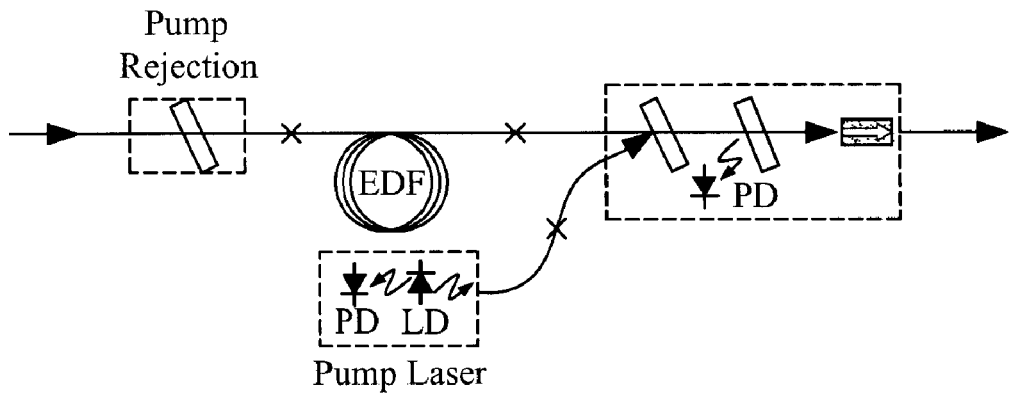
Figure 2D:
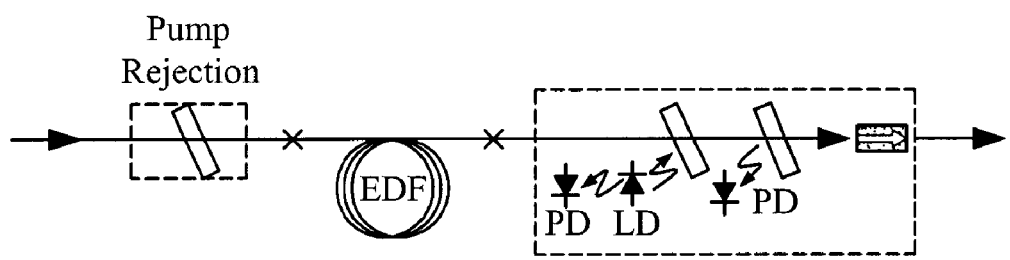

In the EDFA arrangement shown in FIG. 2A, an optical isolator is added. This arrangement prevents back reflection to optical signal source and provides the function of optical power monitoring. However, more components imply more insertion loss and splicing loss to the optical signals. To improve EDFA performance and to decrease the size of the package, hybrid integrated devices have been developed. FIGS. 2B–2D show different configurations with hybrid integrated devices.

FIG. 2B illustrates an EDFA with a combined device to decrease the number of splicing points and to improve reliability. In this example, the hybrid integrated device includes a pump rejection filter, a tap coupler filter and optical isolator. In FIG. 2C the hybrid integrated device is an IFAM (Integrated Fiber Amplifier Module), which includes a pump/signal WDM, a tap filter photodiode and optical isolator. In the meantime, an extra pump rejection filter removes the residual pump power at the input port of the EDFA. For the EDFAs of FIGS. 2B and 2C, the splicing of the single mode fiber with EDF section increases the noise figure and back reflection.

FIG. 2D illustrated an EDFA with an improved IFAM. The pump laser diode chip is added to the hybrid integration module. Although integration is increased, there are yield and reliability problems with the added complexity of the module. A so-called "butterfly" package must be used, instead of a more desirable cylindrical package, resulting in a large package. Higher cost is also a result of the FIG. 2D arrangement.

All these present day EDFA systems have certain common disadvantages. The various component devices are separate or integrated in comparatively large and expensive packages. The pump laser diode whether in a separate package or integrated with other elements must be cooled with the corresponding control circuit complexity and cost. Finally, the splice connection to the amplifying erbium-doped fiber section is made with a mode-mismatched single mode optical fiber, the standard single mode fiber being SMF-28 from Corning, Inc. of Corning, N.Y. A high component count requires more fiber coupling and fusion sections on both signal and pumping paths; these undesirably affect the signal noise figure and pumping efficiency. Furthermore, more assembly of the EDFA components add more costs and lowers the reliability of the assembled system.

Figure 3:
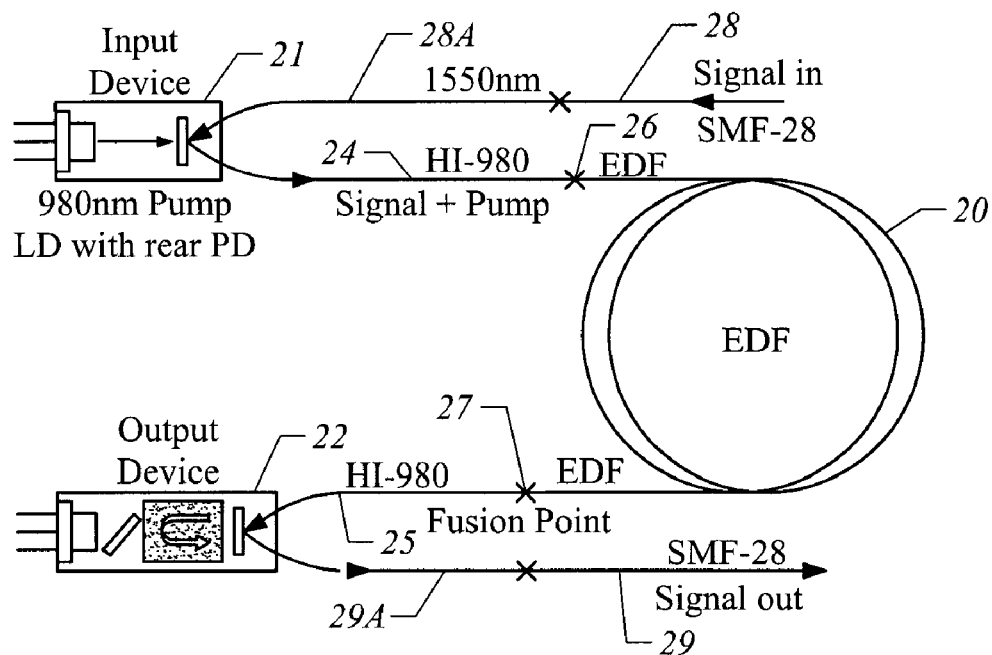
FIG. 3 is a representational diagram of an EDFA system according to one embodiment of the present invention.

To ameliorate these problems, the present invention provides for an EDFA system, such as illustrated in FIG. 3, according to one embodiment of the present invention. The EDFA system has an erbium-doped fiber section 20, an integrated input module 21 and an integrated output module 22. The integrated input module 21 receives a optical signals on an input optical fiber 28, generates pump light, and sends the combined pump light and signals to the EDF section 20, while an integrated output module 22 which transmits the signals from the EDF section 20 to an output optical fiber 29 while monitoring the strength of the amplified optical signals. The integrated output module 22 also blocks signals in the reverse direction from the output optical fiber 29 to the EDF section 20 and also blocks residual pump power light from the EDF section 20 to the optical fiber 29. The input and output fiber sections 28A and 24 respectively of the integrated input module 21 are formed from different optical fibers. The input fiber section 28A is formed from a single mode fiber to match the input optical fiber 28 to which the input fiber section 28A is spliced. This reduces the insertion loss of the splice. Likewise, the output fiber section 24 is formed from an HI-980 optical fiber, which better matches the EDF section 20 than a single mode fiber.

Figure 4A:
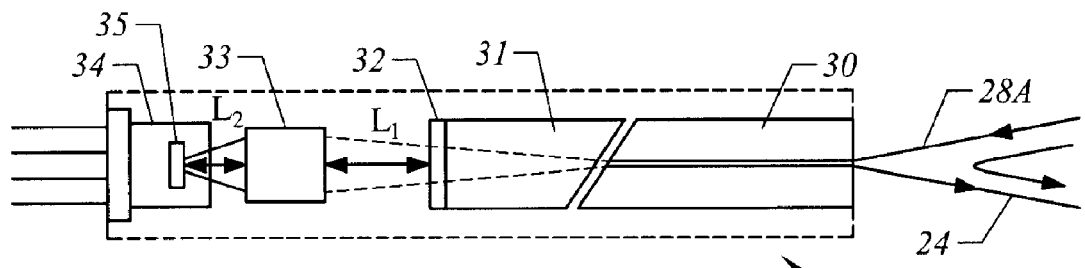
FIG. 4A is a representational drawing of an integrated input module of the FIG. 3 EDFA.

The organization and elements of the integrated input module 21 are illustrated in FIG. 4A. The integrated input module 21 has in the form of an packaged pump laser diode 34. The package is a TO can, specifically, an uncooled CD-5.6 TO package. In front of the packaged pump laser diode 34 is a laser diode collimating lens 33, a WDM filter 32 which discriminates between 1550 nm wavelength signals and 980 nm wavelength light, i.e., between message signals and pump light, a collimating GRIN lens 31, and a glass sleeve 30 with a central capillary channel holding ends of the input fiber section 28A and output fiber section 24. To reduce unwanted reflection, the facets of the sleeve 30 and GRIN lens 31 are reciprocally angled by a small amount, approximately 8°. As described in detail below, the output fiber section 24 also has a fiber collimator and mode transition with a mode transition subsection. All of the elements of the integrated input module 21 are physically symmetrical about a central axis so that the elements readily fit into a cylindrical package, as symbolically indicated by the enclosing dotted line.

The uncooled TO packaged pump laser diode 34 also has a rear photodiode (not shown) for monitoring the output of the laser diode. In contrast to the requirements of handling and mounting a semiconductor die, the already packaged diode 34 saves costs in manufacturing and reliability. CD-5.6 TO package is a well-known, low-cost package format for CD laser and low-end telecom lasers and is preferred in the integrated input module 21. With proper heat dissipation design, the metal package for the entire EDFA system is used as a heat sink for the TO package of the pump laser diode. This allows a CD-5.6 TO packaged laser diode to be effectively driven at high power and the typical manufacturing costs for a EDFA pump laser is significantly lowered. Such packaged laser diodes are available from several suppliers, such as Mitsubishi Electronic Corporation of Tokyo, Japan; Sharp Electronics Corporation, of Osaka, Japan; and Blue Sky Research of Milpitas, Calif.

The flat window 35 in the package of the pump laser diode 34 is coated with antireflection material to prevent facet damage at high optical power, while providing the possibility of wavelength stabilization with a fiber Bragg grating (FBG) placed in the output fiber 24. Because the distance between the active layer of the pump laser diode and the flat window 35 of the TO can package is around 0.5 mm, a laser diode collimating lens 33 (different lenses may be used, including aspherical lens, and flat or spherical facet GRIN lens, as shown in embodiments of the integrated input module 21 in FIGS. 4A and 4B) to help collimate the output light from the pump laser diode 34 onto the GRIN lens 31. The flat surface of the GRIN lens 31 has deposited coatings of thin film dielectric materials to form the WDM filter 32 reflect the 1550 nm signal light and transmits the 980 nm pump light. Accurate control of the $L_1$, the distance between the window 35 and the laser diode collimating lens 33, and $L_2$, the distance between the laser diode collimating lens 33 and the WDM filter 32 at the end of the collimating GRIN lens 31, is important for improving the coupling efficiency of the pump light into the output fiber section 24. In the described embodiment, $L_2$ is usually less than 0.7 mm and $L_1$ is approximately 2 mm depending upon the WDM filter 32 and the length accuracy of the GRIN lens 31.

Figure 5A:
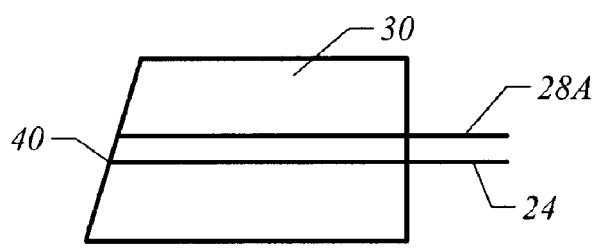
FIG. 5A is a detailed side view of the sleeve holding the ends of the fiber sections of the integrated input module of FIGS. 4A and 4B.

Besides the focusing action of the laser diode collimating lens 33 to improve the coupling efficiency, the integrated input module 21 has a mode-expanded and transition fiber subsections to improve the optical power coupling from the pump laser diode to the HI-980 fiber in the output fiber section 24. FIG. 5A is an expanded cross-sectional view of the glass sleeve 30. In its central capillary channel are the ends of the input fiber section 28A and output fiber section 24. The two fiber sections 28A and 24 are in the same capillary and are drawn separated to illustrate that there are two optical fibers. The end of the input fiber section 28A is a simply a single mode optical fiber, a SMF-28 fiber. On the other hand, the end of the output fiber section 24, enclosed by an ellipse 40 is not HI-980 optical fiber.

Figure 5B:
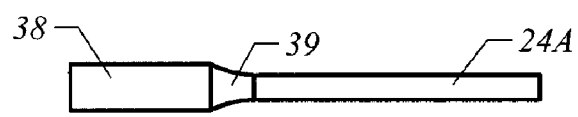
FIG. 5B is a detailed side view of the end of the output fiber section held in the FIG. 5A sleeve.

FIG. 5B is a detail of the output fiber section 24 enclosed by the ellipse 40. Most of the output fiber section 24 is indeed HI-980 optical fiber, which forms the so-called "fiber pigtail," the free optical fiber which is to be connected to another optical fiber, in this case, the end of the EDF section 20. At the end of HI-980 fiber indicated by the numeral 24A, is a fiber transition subsection 39 and the mode-expanded subsection 38. The subsections 38 and 39 are formed by fusing an end of SMF-28 optical fiber to the end of the HI-980 fiber. The SMF-28 fiber is cut and the attached single mode fiber forms the mode-expanded subsection 38 and the fused portions of the SMF-28 and HI-980 fibers form the fiber transition subsection 39. It has been found that a total length of 1.0–1.5 mm for the mode-expanded subsection 38 and fiber transition subsection 39 respectively work effectively. With these subsections 38 and 39, the reflection loss for the incoming optical signals at 1550 nm on the input fiber section 28A and reflected by the WDM filter 32 is decreased considerably. From the FIG. 5B drawing, it is evident that the SMF-28 fiber subsection provides a larger numerical aperture than one formed from HI-980 optical fiber. The reduced insertion loss of the integrated input module 21 improves the noise characteristics of the EDFA system.

Figure 4B:
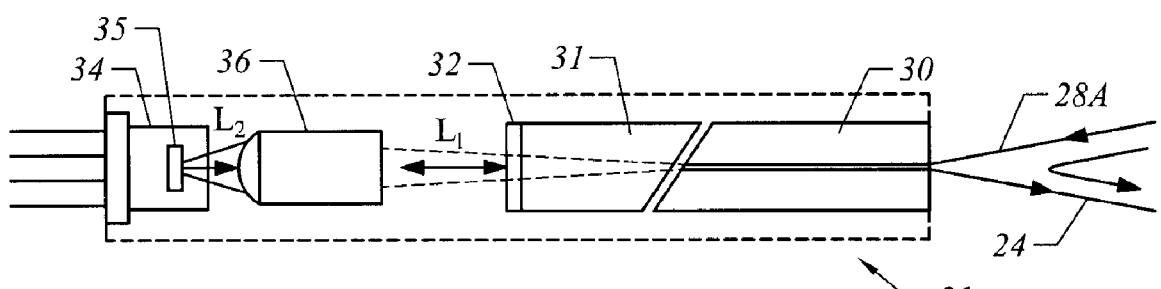
FIG. 4B is a representational drawing of a variation of the integrated input module of the FIG. 4A.

FIG. 4B illustrates the integrated input module 21 with an aspherical facet GRIN lens 36 in place of the flat facet GRIN lens 33 of FIG. 4A. Coupling efficiencies of 40% and 50% respectively have been obtained by combining the mode-expanded transition fiber pigtail with the flat facet GRIN lens 33 of FIG. 4A and of the aspherical facet GRIN lens 36 of FIG. 4B.

Figure 6:
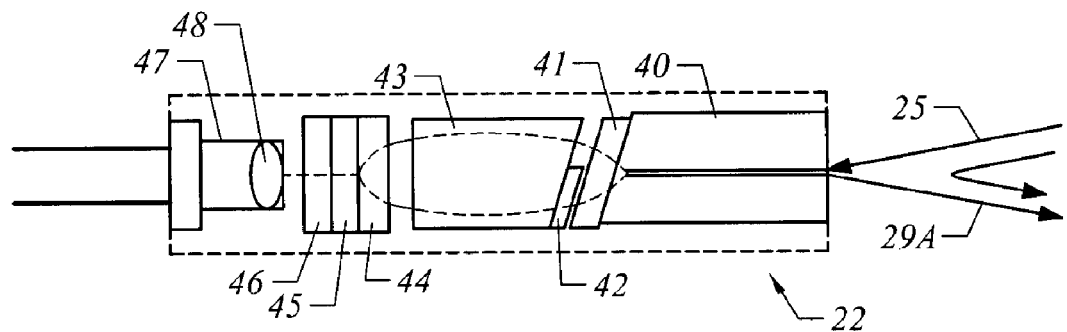
FIG. 6 is a representational drawing of an integrated output module of the FIG. 3 EDFA.

FIG. 6 shows the elements and organization of the integrated output module 22 of EDFA system according to the present invention. The integrated output module 22 has the elements of a reflective optical isolator, a 3% tap filter, a pump rejection filter and a power monitoring photodiode. The integrated output module 22 has a glass sleeve 40 with a central channel capillary channel holding ends of an input fiber section 25 (connected to the EDF section 20) and an output fiber section 29A (connected to the output fiber 29), a walk-off birefringent crystal plate 41 mounted at one end of the sleeve 40, a collimating GRIN lens 43 having a zero-order half-wave plate 42 covering a portion of the GRIN lens end surface facing the sleeve 40, a plate 44 of latching garnet for a 22.5° Faraday rotator on the opposite end surface of the GRIN lens 44, a highly reflecting tap filter 45 of thin film materials deposited upon the Faraday rotator plate 44, a WDM filter 46 of thin film materials deposited on the tap filter 45, and a photodiode 48. Due to the walk-off crystal 41 attached directly to the end surface of the sleeve 40, a quarter-pitch GRIN lens is not used for the GRIN lens 43, but rather a 0.23 pitch GRIN lens or an aspherical rod lens (C-lens) may be employed for collimating light. The elements, except for the half-wave plate 42 of the integrated output module 22 are physically symmetrical about a central axis so as to readily fit into a cylindrical package, as symbolically indicated by the enclosing dotted line. Furthermore, the facing end surfaces of the sleeve 40 and GRIN lens 43 are reciprocally angled by a small amount, approximately 8°.

The reflective optical isolator is formed by the walk-off birefringent crystal 41, such as $YVO_4$ or rutile, 0.20 mm thick, the zero-order half-wave plate 42, and the Faraday rotator plate 44. The optical axis of the walk-off crystal 41 and the half-wave plate 42 are oriented such that the light signals from the output fiber section 29A are blocked from being reflected back to the input fiber section 25, while signals from the input fiber section 25 are reflected back to the output fiber section 29A.

Figure 7:
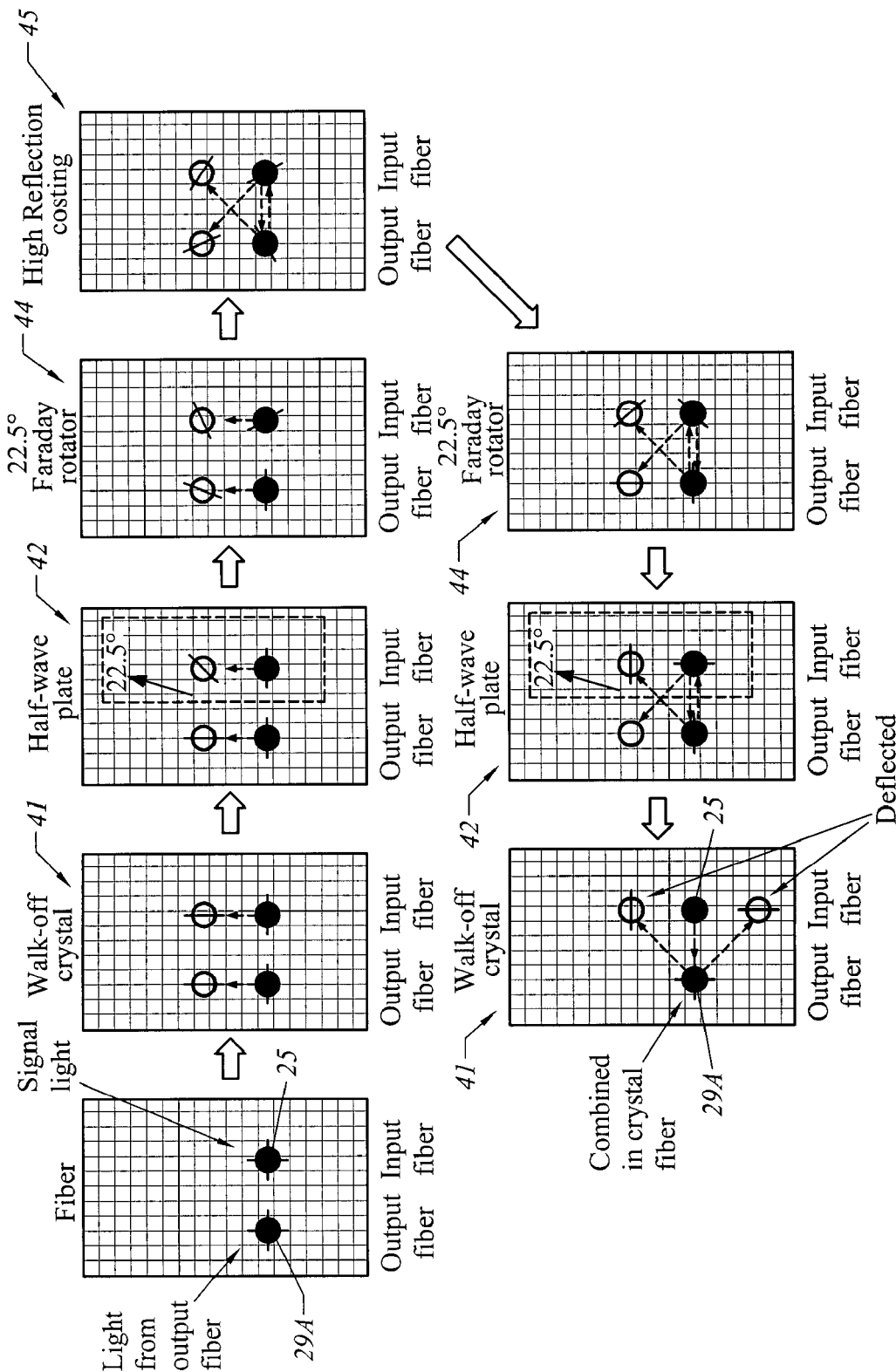
FIG. 7 illustrates the operation of the optical isolator in the integrated output module of FIG. 6 with the cross-sectional front views of the different elements of the optical isolator.

The cross-sectional frontal views of FIG. 7 illustrate the operation and function of each of the elements which comprise the optical isolator of the integrated output module 22. The initially horizontal and vertical bars over the circles representing the output fiber section 29A and input fiber section 25 are the orthogonal, linear polarization states of the light coming into the integrated output module 22. Again for purposes of explanation, the circles are displaced from each other, though the output fiber section 29A and input fiber section 25 fixed together in the capillary channel of the sleeve 40. The dotted arrows from the output fiber section 29A and input fiber section 25 circles indicate the source of the represented polarization state. Hence the initial action of the walk-off crystal 41 displaces upward the vertically polarized light from the output fiber section 29A and input fiber section 25, while the locations of the horizontally polarized light are unchanged. The action of the highly reflecting tap filter 45 horizontally displaces the horizontally and vertically polarized light from one fiber section toward the other fiber section. The net result is that the horizontally and vertically polarized light from the input fiber section 25 is combined at the end of the output fiber section 29A; while the horizontally and vertically polarized light from the output fiber section 29A is not combined and neither of these polarization components fall on the end of the input fiber section 25. Light travels from the input fiber section 25 to the output fiber section 29A, but not in the opposite direction.

The input fiber section 25, which is spliced to the EDF section 20, is also formed from HI-980 optical fiber with a mode expansion and mode transition subsections at the fiber's end, as described with respect to FIG. 5B. Together with a proper orientation of the optical axis of the walk-off crystal 41 and half-wave plate 42, the mode expansion and transition subsections obtain low insertion loss and high isolation performance for the integrated output module 22.

Furthermore, the integrated output module 22 also filters out any residual laser pump light from the input fiber section 25 and the EDF section 20. The latching garnet Faraday rotator plate 44 is highly absorbent to 980 nm light. Light at that wavelength suffers a 20 dB loss in passing through the plate. Secondly, the tap filter 45 is highly reflective and reflects back most of the light to the output fiber section 29A. Nonetheless, the tap filter 45 allows about 3% of the output optical power to pass through to the photodiode 47 to monitor the output optical power of the EDFA system. The WDM filter 46 is extremely reflective to 980 nm wavelength light and prevents the residual pump light from entering the photodiode 48. The leakage of pump laser light into the photodiode 48 deteriorates the accuracy of the optical power monitoring and decreases the dynamic range of the optical power monitor. Since the location of WDM filter 46 is displaced from the tap filter 45 with respect to the ends of the fiber sections 25 and 29A, any 980 nm light reflected by the filter 46 is not focused at the end of the output fiber section 29A.

The described EDFA system of FIG. 3 can be highly miniaturized. The integrated input module 21 can be fitted into a cylindrical package of 25 mm length and 6 mm diameter; likewise, the integrated output module 22 can be fitted into a cylindrical package of 18 mm length and 4 mm diameter. With the splice connections to HI-980 optical fiber, the EDF section 20 can be wound more tightly into loops of 24 mm diameter. Altogether, the complete EDFA system can be fitted into a metal package of 40 mm×70 mm×12 mm, a very small EDFA system package. Hence the advantages of the present invention include 1) the integrated input/output modules are cylindrical to decrease the package size; (2) only HI-980 fiber and erbium-doped fiber are used within the EDFA package to make it even smaller; (3) the TO can pump laser diode in the integrated input module significantly reduces the cost of the pump laser diode; (4) the pump laser is uncooled for a reduction in control circuit complexity and in power consumption; and (5) the optical components are shared for additional cost reductions.

Figure 8A:
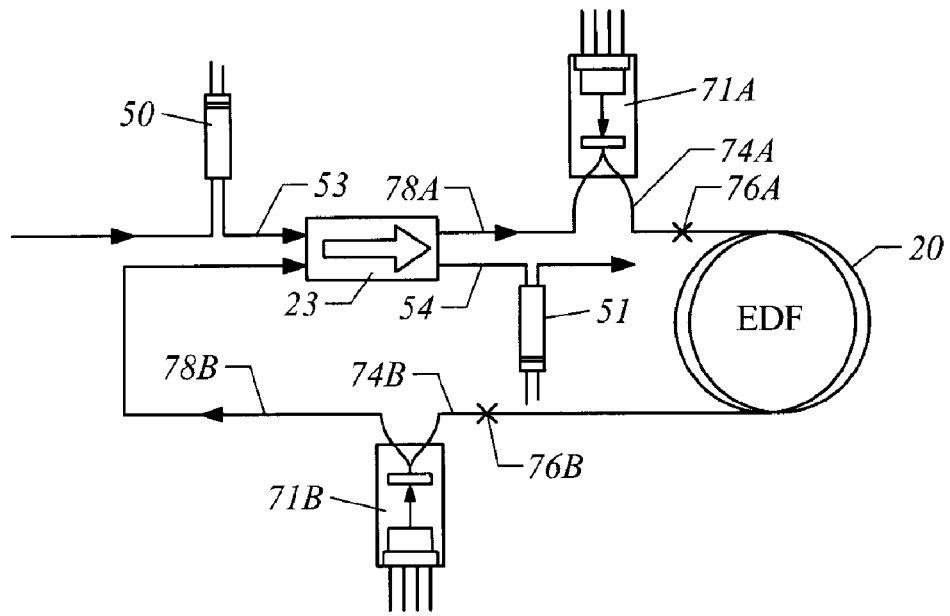
FIG. 8A is a block diagram of a double-pumped EDFA system with a twin optical isolator, according to another embodiment of the present invention.

FIG. 8A illustrates another EDFA system within a twin optical isolator to provide additional cost savings, according to the present invention. The EDFA system has an erbium-doped fiber section 20 which is double-pumped by two integrated input modules 21A and 21B at either end of the section 20, and a twin optical isolator 23. For the EDFA system illustrated in FIG. 8A, the input optical fiber is connected to a miniature optical power monitor 50 to check on the power of the incoming optical signals. The power monitor 50 is connected by an optical fiber section 53 to the twin optical isolator 23 which is connected to a first integrated input module 71A. The optical isolator 23 ensures that optical signals only travel from the input optical fiber to the integrated input module 21A where pump laser signals are combined with the optical signals and passed to the EDF section 20 through a HI-980/EDF splice 76A. The other end of the EDF section 20 is connected to a second integrated input module 71B by a corresponding EDF/Hi-980 splice 76B. The integrated input module 71B sends its pump signals to the section 20 through its HI-980 fiber section 74B and receives the amplified signals of the section 20 through the same fiber section 74B. The amplified signals are passed through to the output fiber section 78B which is connected to the twin optical isolator 23. The input and output roles of the fiber sections 74B and 78B of the second integrated input module 71B are reversed compared to the physically corresponding fiber sections 74A and 78A of the first integrated input module 71A. Returning to the twin optical isolator 23, the corresponding output of the output fiber section 78B is a fiber section 54 connected to the output fiber of the EDFA system through a second miniature optical power monitor 51 which checks on the power of the outgoing optical signals from the EDFA system.

Figure 8B:
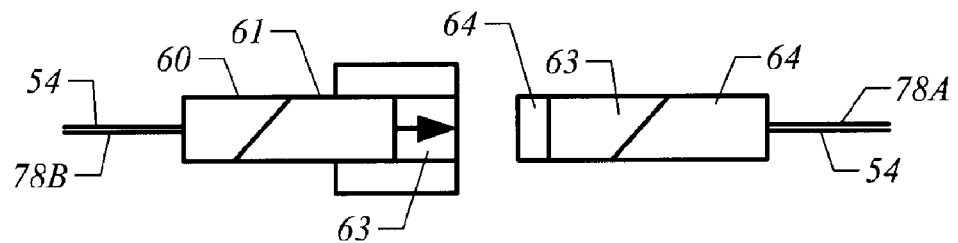
FIG. 8B is a cross-sectional diagram of the twin optical isolator in the FIG. 8A EDFA system.

Serving two isolation functions, the twin optical isolator 23 saves package space and cost. FIG. 8B shows the schematic diagram of the twin isolator with a bandpass filter. The optical isolator 23 has a first glass sleeve 60 with a central capillary channel which holds the ends of the optical fiber section 53 and output fiber section 78B of the second integrated input module 71B. A collimating lens 61 is located in the interior end of the sleeve 60. Facing in the opposite direction is a second glass sleeve 64 with a central capillary channel which holds the ends of the input fiber section 78A of the integrated input module 71A and the fiber section 54. A second collimating lens 63 is located at the interior end of the sleeve 64 to face the first collimating lens 61. The collimating lenses 61 and 63 may be GRIN lens or C-lens, but the C-lenses have better performance and yields than conventional GRIN lenses. Between the collimating lenses 61 and 63 is a conventional optical isolator core 65 formed by a sandwich structure of birefringent crystal wedge/Faraday rotator/birefringent crystal wedge. Details of such optical isolators are found in the literature. See, for example, U.S. Pat. No. 5,208,876, which issued May 4, 1993. The ends of the input fiber sections 53, 78B and the output fiber sections 78A, 54 are arranged and oriented so that light from the section 53 is transmitted to the section 78A and light from the section 78B is transmitted to the section 54. Of course, light in the opposite direction is blocked.

Deposited on the interior end of the collimating lens 63 are thin films forming a bandpass or lowpass filter 66. The bandpass or lowpass filter 66 can be employed for flattening the gain and/or for ASE reduction of the EDFA system.

Figure 9:
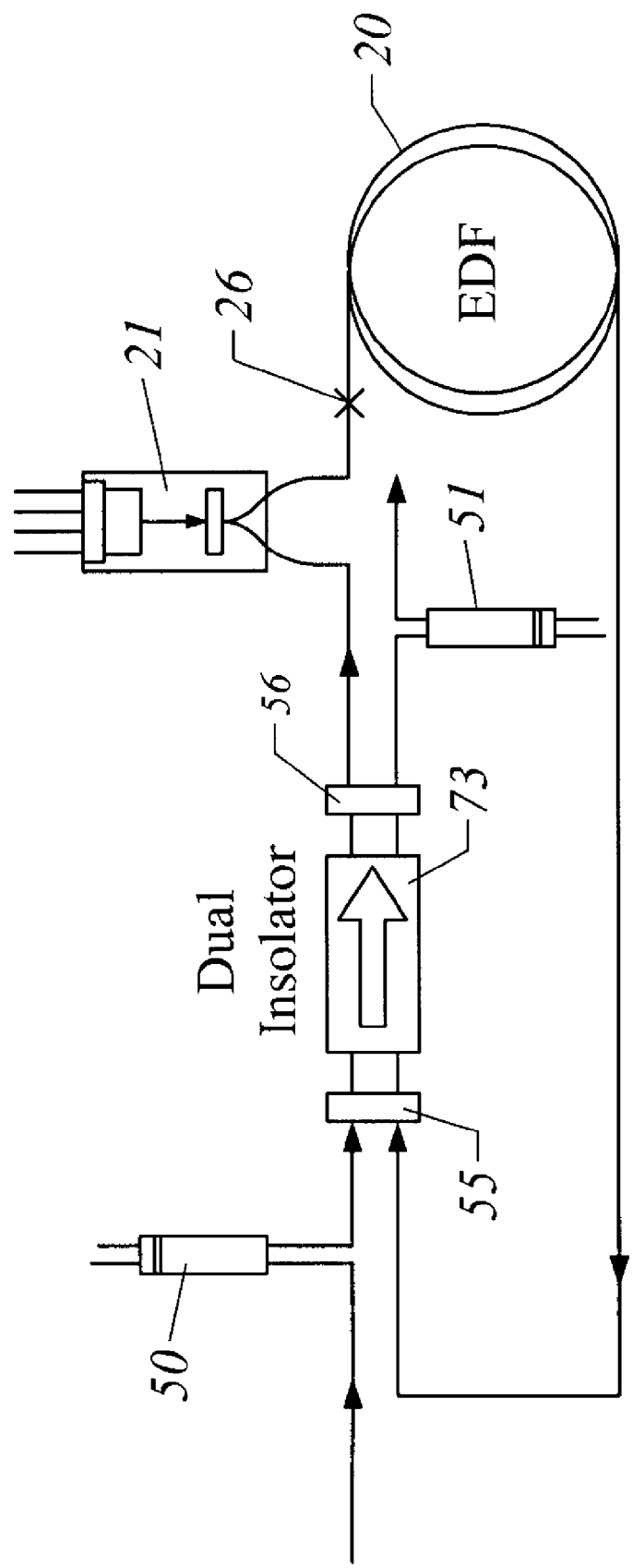
FIG. 9 is a block diagram of an EDFA system with a twin optical isolator and no integrated output module, according to still another embodiment of the present invention.

FIG. 9 illustrates still another EDFA system with a twin optical isolator, according to another embodiment of the present invention. The EDFA system has an erbium-doped fiber section 20, and only one integrated input module 71 and a twin optical isolator 73 which does not have an internal filter. The FIG. 9 EDFA system is similar to the FIG. 8A system; however, the output end of the EDF section 20 forms one of the input fibers to the twin optical isolator 73. Furthermore, a bandpass or lowpass filter 55 is placed at the input end of the twin optical isolator 73 and is external to the twin optical isolator. Alternatively, a bandpass or lowpass filter may be placed at the output end of the twin optical isolator 73 as indicated by the dotted rectangle 56.

A low-cost, high miniaturized narrowband EDFA has many uses and applications. The EDFA can be used over the C-band of a WDM network as a booster amplifier to provide power amplification to the optical transmitter and as a pre-amplifier for an optical receiver to amplify weak optical signals. The applications include single channel optical fiber transmitter systems, WDM transmitter systems, optical cross-connects and wavelength add/drop multiplexers, metro/edge networks and optical transceiver modules.

In a high-speed single channel system, for example, a high saturated output power booster EDFA for the transmitter and a low noise figure pre-amplifier for the receiver can be combined to reach high Signal-to-Noise ratios (SNRs) and a low Bit Error Rate (EBR). The EDFA can be tailored for particular system requirements.

The narrowband EDFAs can be used as optical amplification elements for bands of WDM channels in an optical VMUX/DEMUX to decrease the total cost of optical amplifiers in the network and to increase the flexibility and upgradability of the optical network. (A VMUX is a combined variable optical attenuator (VOA) and multiplexer (MUX) for the functions of WDM multiplexing and power balancing in the WDM channels in one device.) For an optical add/drop multiplexer in the network, the EDFA can be used to amplify signals dropped from the network, or signals before they are added to the network. The EDFA can used to preamplify signals before they are processed by a dispersion compensator module and to amplify the signals after they are processed. In an optical cross-connect system, EDFAs can amplify signals entering the cross-connect system and leaving the system to compensate for optical loss in the optical path.

Therefore, while the description above provides a full and complete disclosure of the preferred embodiments of the present invention, various modifications, alternate constructions, and equivalents will be obvious to those with skill in the art. Thus, the scope of the present invention is limited solely by the metes and bounds of the appended claims.

What is claimed is:

1. An integrated input module for an EDFA for amplifying optical signals, said integrated input module comprising
    a sleeve having a longitudinal capillary channel holding ends of a first optical fiber section and a second optical fiber section;
    a laser diode mounted in a package, said laser diode generating laser pump light though said laser diode package;
    a first collimating lens proximate said laser diode;
    a second collimating lens proximate said sleeve and said ends of said first optical fiber section and said second optical fiber section,
    a wavelength-dependent filter between said first and second collimating lens, said wavelength-dependent filter passing laser pump light and reflecting said optical signals, said ends of said optical fiber sections, said laser diode, said first collimating lens, said second collimating lens, and said wavelength-dependent filter arranged and oriented with respect to each other so that laser pump light from said laser diode is focused on said first optical fiber section end and so that optical signals from one of said optical fiber sections is passed to the other of said optical fiber sections.

2. The integrated input module of claim 1 wherein said laser diode package comprises a TO-can.

3. The integrated input module of claim 1 further comprising a cylindrical package holding said sleeve, said laser diode package, said first collimating lens, said second collimating lens, and said wavelength dependent filter.

4. The integrated input module of claim 3 wherein said cylindrical package has dimensions no larger than 25 mm long and 6 mm diameter.

5. The integrated input module of claim 1 wherein said first optical fiber section comprises an optical fiber having transmission modes matching those of an erbium-doped optical fiber section.

6. The integrated input module of claim 5 wherein said first optical fiber section comprise HI-980 optical fiber.

7. The integrated input module of claim 6 wherein said end of said first optical fiber section comprises a mode-expanded subsection and a fiber transition subsection.

8. The integrated input module of claim 7 wherein said mode-expanded subsection comprises SMF-28 optical fiber.

* * * * *